(12) United States Patent
Chi et al.

(10) Patent No.: US 10,074,332 B2
(45) Date of Patent: Sep. 11, 2018

(54) DISPLAY PANEL AND DRIVING METHOD THEREOF

(71) Applicant: AU Optronics Corporation, Hsin-Chu (TW)

(72) Inventors: Yu-Min Chi, Hsin-Chu (TW); Sung-Yu Su, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 23 days.

(21) Appl. No.: 15/433,069

(22) Filed: Feb. 15, 2017

(65) Prior Publication Data

US 2018/0061351 A1   Mar. 1, 2018

(30) Foreign Application Priority Data

Aug. 29, 2016  (TW) .................................. 105127721

(51) Int. Cl.
*G09G 3/36* (2006.01)
*H01L 27/12* (2006.01)

(52) U.S. Cl.
CPC ......... *G09G 3/3677* (2013.01); *G09G 3/3688* (2013.01); *H01L 27/124* (2013.01); *G09G 2300/0465* (2013.01); *G09G 2310/0251* (2013.01); *G09G 2310/08* (2013.01)

(58) Field of Classification Search
CPC combination set(s) only.
See application file for complete search history.

(56) References Cited

U.S. PATENT DOCUMENTS

| 7,688,414 | B2* | 3/2010 | Oh ..................... G02F 1/136227 349/141 |
| 8,405,646 | B2 | 3/2013 | Lo et al. |
| 8,743,331 | B2* | 6/2014 | Song ................. G02F 1/133707 349/129 |
| 9,391,132 | B2* | 7/2016 | Koyama ............. H01L 27/3258 |
| 9,423,660 | B2 | 8/2016 | Huang et al. |
| 2010/0097546 | A1* | 4/2010 | Chang ............... G02F 1/136209 349/111 |
| 2010/0259512 | A1 | 10/2010 | Lin et al. |
| 2014/0375534 | A1 | 12/2014 | Lee et al. |
| 2016/0246102 | A1* | 8/2016 | Hsu ................... G02F 1/134309 |

* cited by examiner

*Primary Examiner* — Van Nguyen Chow
(74) *Attorney, Agent, or Firm* — WPAT, PC

(57) ABSTRACT

A display panel includes a plurality of scanning lines, a plurality of conductive lines, a plurality of data lines, a first pixel, a second pixel, a third pixel and a fourth pixel. The data lines and the conductive lines are parallel. Each of the conductive lines is electrically coupled to one of the scanning lines, so as to transmit at least one gate pulse. The first pixel and the second pixel are located between a first data line and a first conductive line. The first pixel is electrically coupled to the first data line and a first scanning line. The second pixel is electrically coupled to the first pixel and a second scanning line. The third pixel and the fourth pixel are located between the first data line and a second conductive line. The third pixel is electrically coupled to the first data line and a third scanning line. The fourth pixel is electrically coupled to the third pixel and a fourth scanning line.

11 Claims, 8 Drawing Sheets

DISPLAY PANEL AND DRIVING METHOD THEREOF

BACKGROUND

Technical Field

The present invention relates to a display panel, and in particular, to a display panel and a driving method thereof.

Related Art

Liquid crystal display (LCD) apparatus has features such as thin shape, low power consumption, and no radiation pollution, and therefore is widely applied to electronic products such as computer screen, mobile phone, personal digital assistant (PDA), and flat screen television.

In pixel array structures of current LCD panels, there is one type of pixel array structures that is called half source driving (HSD) architecture. The HSD architecture can reduce the number of source lines by a half, so as to achieve an objective of reducing the number of source drivers by a half. Therefore, costs of panel modules can be substantially reduced. Besides, there is a pixel array structure called one third source driving (OTSD) architecture, which reduces the number of source lines to one third of source lines of original architecture, so as to save more production costs.

SUMMARY

Different from architecture of a conventional display panel, an objective of the present invention is to provide a display panel, comprising: a plurality of scanning lines, a plurality of conductive lines, a plurality of data lines, a first pixel, a second pixel, a third pixel, and a fourth pixel. The plurality of scanning lines is located along a first direction. The plurality of conductive lines is located along a second direction. The data lines and the conductive lines are parallel. Each of the conductive lines is configured to electrically couple to one of the scanning lines, so as to transmit at least one gate pulse. The first pixel is located between a first data line in the data lines and a first conductive line in the conductive lines, and is configured to electrically couple to the first data line and a first scanning line in the scanning lines. The second pixel is located between the first data line and the first conductive line, is configured to electrically couple to the first pixel, and electrically couple to a second scanning line in the scanning lines. The third pixel is located between the first data line and a second conductive line, and is configured to electrically couple to the first data line and a third scanning line in the scanning lines, wherein the first conductive line W1 and the second conductive line W2 are two adjacent conductive lines and are located on different sides of the first data line respectively. The fourth pixel is located between the first data line and the second conductive line, is configured to electrically couple to the third pixel, and electrically couple to a fourth scanning line in the scanning lines. An objective of the present invention is to provide a driving method of a display panel. The driving method of a display panel is provided, the display panel comprises a plurality of scanning lines, a plurality of conductive lines, a plurality of data lines, a first pixel, a second pixel, a third pixel, and a fourth pixel, wherein the scanning lines are located along a first direction, the conductive lines are located along a second direction, the data lines are substantially parallel to the conductive lines, each of the conductive lines is configured to electrically couple to one of the scanning lines, so as to transmit at least one gate pulse, the first pixel is configured to electrically couple to a first scanning line, the second pixel is configured to electrically couple to a second scanning line, the third pixel is configured to electrically couple to a third scanning line, and the fourth pixel is configured to electrically couple to a fourth scanning line, and the driving method comprises: transmitting data to the first pixel through a first data line in the data lines, and transmitting the data to the second pixel through the first pixel, wherein the first pixel and the second pixel are arranged between the first data line and a first conductive line in the conductive lines; and transmitting data to the third pixel through the first data line, and transmitting the data to the fourth pixel through the third pixel, wherein the third pixel and the fourth pixel are arranged between the first data line and a second conductive line, the first conductive line and the second conductive line are two adjacent conductive lines, the first conductive line and the second conductive line are located on different sides of the first data line respectively, and each of the first scanning line, the second scanning line, the third scanning line, and the fourth scanning line receives a first gate pulse and a second gate pulse through a corresponding conductive line.

The display panel in the present invention uses a pixel array structure with quarter source driving (QSD) architecture, so as to charge four pixels by means of one data line. With this architecture, the number of source lines is reduced to a quarter of the number of source lines of original architecture, thereby saving production costs. In addition, a gate driving circuit and a source driving circuit are located on a same side, or a gate driving circuit and a source driving circuit are located on opposite sides of a pixel array, which facilitates application of a narrow bezel technology to a display panel. Further, the display panel in the present invention uses a pixel array structure with QSD architecture, four pixels are located between every two conductive lines, and only one data line is located between two adjacent conductive lines. In this way, wiring of conductive lines and data lines causes no overlapping and interleaving, that is, there is no need to wire the conductive lines and the data lines in different circuit layers, which saves more production costs. Besides, a decrease in wires also achieves a superior aperture ratio.

DETAILED DESCRIPTION

Figure 1:
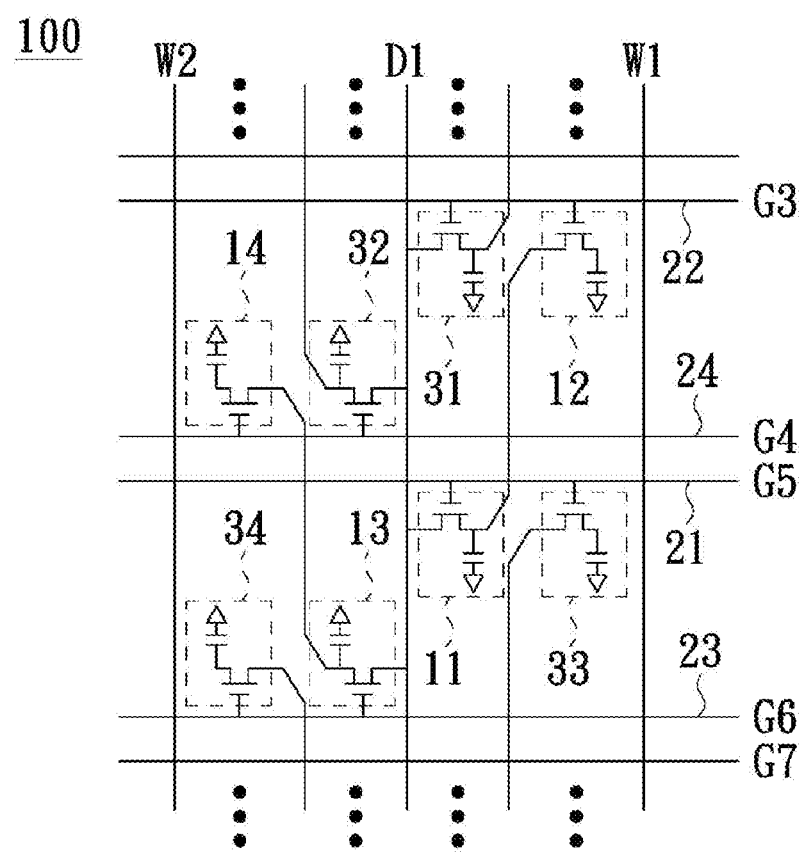
FIG. 1 is a circuit diagram of a display panel according to a first embodiment of the present invention.

FIG. 1 shows a display panel 100 according to an embodiment of the present invention, including: a plurality of scanning lines, a plurality of conductive lines, a plurality of data lines, and a plurality of pixels. The plurality of scanning lines is located along a first direction, the plurality of conductive lines is located along a second direction, and the data lines are substantially parallel to the conductive lines. In the embodiments of the present invention, a gate driving circuit and a source driving circuit are located on a same side, or a gate driving circuit and a source driving circuit are located on two opposite sides of a pixel array, so that each conductive line is electrically coupled to one of the scanning lines, so as to transmit a gate pulse to the scanning line.

In the embodiments of the present invention, description is made by using a first conductive line W1, a second conductive line W2, a first data line D1, a first scanning line 21, a second scanning line 22, a third scanning line 23, a fourth scanning line 24, a first pixel 11, a second pixel 12, a third pixel 13, and a fourth pixel 14 as examples, so that arrangements of the plurality of scanning lines, the plurality of conductive lines, the plurality of data lines, and a plurality of pixel array structures of the display panel in the present invention can be known. The first pixel 11 is located between the first data line D1 in the data lines and the first conductive line W1 in the conductive lines, and is configured to electrically couple to the first data line D1 and the first scanning line 21 in the scanning lines. A control terminal of the first pixel 11 is coupled to the first scanning line 21, a first terminal is coupled to the first data line D1, and a second terminal is coupled to a pixel capacitor. The second pixel 12 is located between the first data line D1 and the first conductive line W1. The second pixel 12 is electrically coupled to the first pixel 11 and is electrically coupled to the second scanning line 22 in the scanning lines. A control terminal of the second pixel 12 is coupled to the second scanning line 22, a first terminal is coupled to a second terminal of the first pixel 11, and a second terminal is coupled to a pixel capacitor. The third pixel 13 is located between the first data line D1 and the second conductive line W2 in the conductive lines. The third pixel 13 is electrically coupled to the first data line D1 and the third scanning line 23 in the scanning lines. A control terminal of the third pixel 13 is coupled to the third scanning line 23, a first terminal is coupled to the first data line D1, and a second terminal is coupled to a pixel capacitor. The fourth pixel 14 is located between the first data line D1 and the second conductive line W2. The fourth pixel 14 is electrically coupled to the third pixel 13 and is electrically coupled to the fourth scanning line 24 in the scanning lines. Besides, the first pixel 11 and the second pixel 12 are located at different pixel rows, the third pixel 13 and the fourth pixel 14 are located at different pixel rows, the first conductive line W1 and the second conductive line W2 are two adjacent conductive lines in the conductive lines, and the first conductive line W1 and the second conductive line W2 are located on different sides of the first data line D1 respectively.

Figure 2:
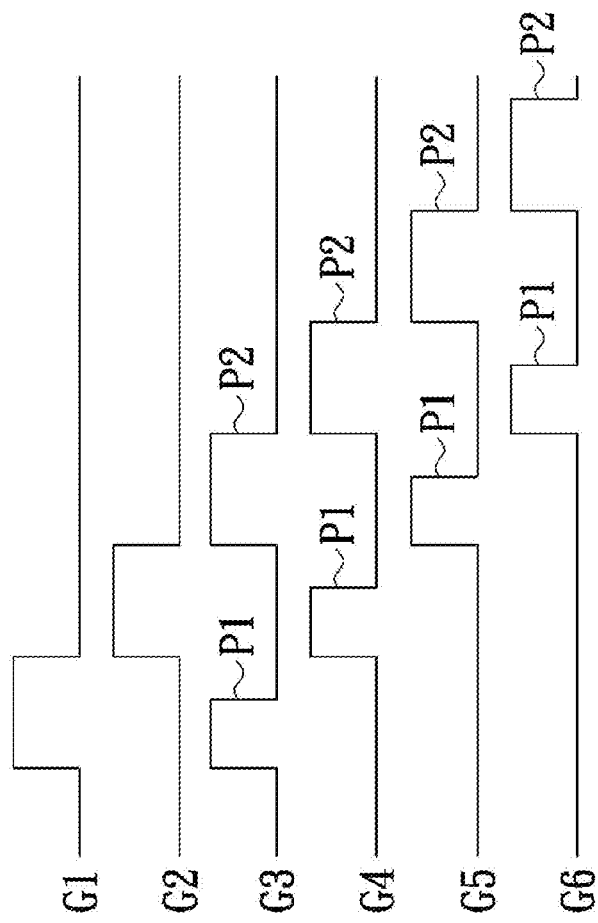
FIG. 2 shows a signal timing diagram of the display panel according to FIG. 1.

FIG. 2 shows a signal timing diagram of the display panel according to FIG. 1. Refer to FIG. 1 and FIG. 2 together, in the display panel 100 according to the first embodiment, the driving method of the display panel is described by using scanning lines G3-G6 as examples, wherein the scanning line G5 is used as the first scanning line 21, the scanning line G3 is used as the second scanning line 22, the scanning line G6 is used as the third scanning line 23, and the scanning line G4 is used as the fourth scanning line 24. Each of the scanning lines G3-G6 receives a first gate pulse P1 and a second gate pulse P2 through a corresponding conductive line. In the first embodiment, when one of the first gate pulses P1 and the second gate pulses P2 of the first scanning line 21 and the second scanning line 22 is at an enable level, the first gate pulses P1 and the second gate pulses P2 of the third scanning line 23 and the fourth scanning line 24 are disabled, and when one of the first gate pulses P1 and the second gate pulses P2 of the third scanning line 23 and the fourth scanning line 24 is at an enable level, the first gate pulses P1 and the second gate pulses P2 of the first scanning line 21 and the second scanning line 22 are disabled. Enable periods of the first gate pulses P1 are less than enable periods of the second gate pulses P2, each of the first gate pulses P1 is earlier than the corresponding second gate pulse P2, the first gate pulse P1 of the scanning line G5 and the second gate pulse P2 of the scanning line G3 are synchronously switched to enable levels, and the first gate pulse P1 of the scanning line G6 and the second gate pulse P2 of the scanning line G4 are synchronously switched to enable levels.

In a period that the first gate pulse P1 of the scanning line G5 and the second gate pulse P2 of the scanning line G3 are synchronously switched to enable levels, the first pixel 11 and the second pixel 12 are turned on, the first data line D1 transmits data to the first pixel 11, and transmits the data to the second pixel 12 through the first pixel 11, so as to charge the second pixel 12. Subsequently, the first gate pulse P1 of the scanning line G5 is disabled, the first data line D1 cannot charge the second pixel 12 through the first pixel 11, and therefore, a voltage of the second pixel 12 is fixed. At this time, the second gate pulse P2 of the scanning line G3 is still enabled, so as to keep charging the pixel 31 until the second gate pulse P2 of the scanning line G3 is disabled. The second pixel 12 and the third pixel 31 are turned off after the second gate pulse P2 of the scanning line G3 is disabled, and therefore, the voltages of the second pixel 12 and the pixel 31 do not change.

After the second gate pulse P2 of the scanning line G3 is disabled, the first gate pulse P1 of the scanning line G6 and the second gate pulse P2 of the scanning line G4 are synchronously enabled, in a period that the first gate pulse P1 of the scanning line G6 and the second gate pulse P2 of the scanning line G4 are switched to enable levels, the third pixel 13 and the fourth pixel 14 are turned on, the first data line D1 transmits data to the third pixel 13, and transmits data to the fourth pixel 14 through the third pixel 13, so as to charge the fourth pixel 14. Subsequently, the first gate pulse P1 of the scanning line G6 is disabled, the first data line D1 cannot charge the fourth pixel 14 through the third pixel 13, and therefore, a voltage of the fourth pixel 14 is fixed. At this time, the second gate pulse P2 of the scanning line G4 is still enabled, so as to keep charging the pixel 32 until the second gate pulse P2 of the scanning line G4 is disabled. The fourth pixel 14 and the pixel 32 that are turned on through the scanning line G4 are turned off after the second gate pulse P2 of the scanning line G4 is disabled, and therefore, the voltages of the fourth pixel 14 and the pixel 32 do not change.

By means of the foregoing description of the driving method of the display panel 100 according to the first embodiment, it can be known that the first data line D1 charges the second pixel 12, the fourth pixel 14, the pixel 31, and the pixel 32. Besides, after the second gate pulse P2 of the scanning line G4 is disabled, the first gate pulse P1 (not shown in the figures) of the scanning line G7 and the second gate pulse P2 of the scanning line G5 are synchronously enabled, and the first data line D1 charges the first pixel 11, the third pixel 13, the pixel 33, and the pixel 34 through four scanning lines G5-G8.

Figure 3:
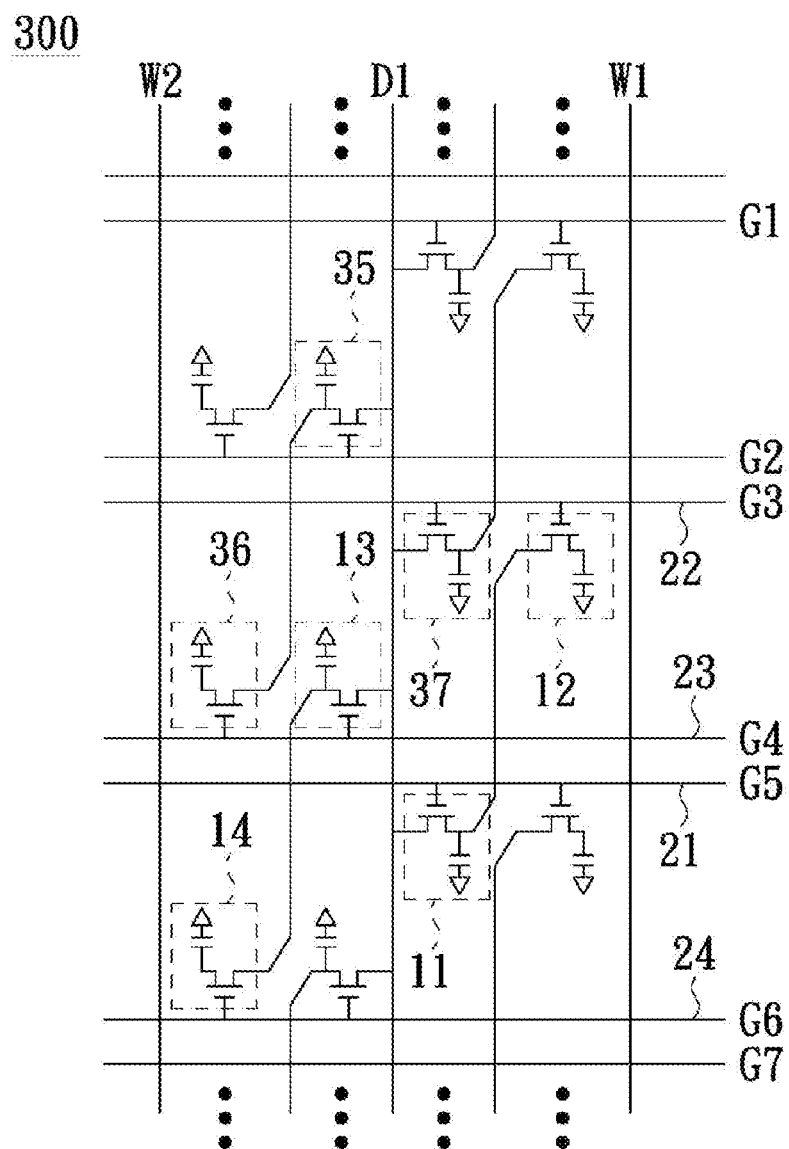
FIG. 3 is a circuit diagram of a display panel according to a second embodiment of the present invention.
Figure 4:
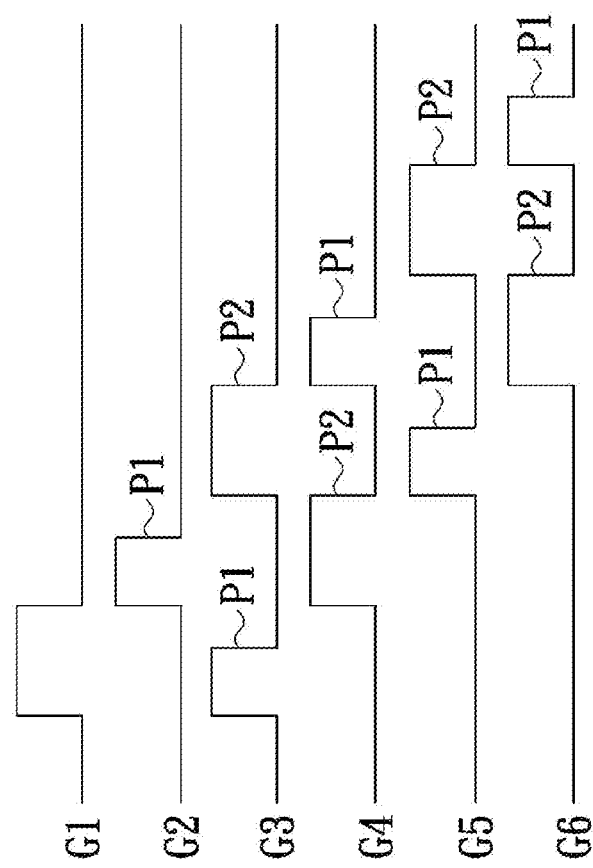
FIG. 4 shows a signal timing diagram of the display panel according to FIG. 3.

FIG. 3 shows a display panel 300 according to a second embodiment, the display panel 300 differs from the display panel 100 in that, the scanning line G5 is used as the first scanning line 21, the scanning line G3 is used as the second scanning line 22, the scanning line G4 is used as the third scanning line 23, and the scanning line G6 is used as the fourth scanning line 24. FIG. 4 shows a signal timing diagram of the display panel 300 according to FIG. 3. In the second embodiment, enable periods of first gate pulses P1 are less than enable periods of second gate pulses P2, each of the first gate pulses P1 of the first scanning line 21 and the second scanning line 22 is earlier than the corresponding second gate pulse P2, each of the second gate pulses P2 of the third scanning line 23 and the fourth scanning line 24 is earlier than the corresponding first gate pulse P1, the first gate pulse P1 of the first scanning line 21 and the second gate pulse P2 of the second scanning line 22 are synchronously switched to enable levels, and the first gate pulse P1 of the third scanning line 23 and the second gate pulse P2 of the fourth scanning line 24 are synchronously switched to enable levels.

Subsequently, referring to FIG. 3 and FIG. 4 together, in a period that the first gate pulse P1 of the scanning line G2 and the second gate pulse P2 of the scanning line G4 are synchronously switched to the enable levels, the pixel 35 and the pixel 36 are turned on, the first data line D1 transmits data to the pixel 35, and transmits the data to the pixel 36 through the pixel 35, so as to charge the pixel 36. Subsequently, the first gate pulse P1 of the scanning line G2 is disabled, and the first data line D1 cannot charge the pixel 36 through the pixel 35. The pixel 35 that is turned on through the scanning line G2 is turned off after the first gate pulse P1 is disabled, and therefore, the voltages of the pixel 35 and the pixel 36 that is charged through the pixel 35 do not change. After the second gate pulse P2 of the scanning line G4 is disabled, in the period that the first gate pulse P1 of the scanning line G5 and the second gate pulse P2 of the scanning line G3 are synchronously switched to the enable levels, the first pixel 11 and the second pixel 12 are turned on, the first data line D1 transmits data to the first pixel 11, and transmits the data to the second pixel 12 through the first pixel 11, so as to charge the second pixel 12. Subsequently, the first gate pulse P1 of the scanning line G5 is disabled, the first data line D1 cannot charge the second pixel 12 through the first pixel 11, and therefore, a voltage of the second pixel 12 is fixed. At this time, the second gate pulse P2 of the scanning line G3 is still enabled, so as to keep charging the pixel 37 until the second gate pulse P2 of the scanning line G3 is disabled. The second pixel 12 and the pixel 37 that are turned on through the scanning line G3 are turned off after the second gate pulse P2 of the scanning line G3 is disabled, and therefore, the voltages of the second pixel 12 and the pixel 37 are fixed.

After the second gate pulse P2 of the scanning line G3 is disabled, the first gate pulse P1 of the scanning line G4 and the second gate pulse P2 of the scanning line G6 are synchronously enabled, in a period that the first gate pulse P1 of the scanning line G4 and the second gate pulse P2 of the scanning line G6 are switched to the enable levels, the third pixel 13 and the fourth pixel 14 are turned on, the first data line D1 transmits data to the third pixel 13, and transmits data to the fourth pixel 14 through the third pixel 13, so as to charge the fourth pixel 14. Subsequently, the first gate pulse P1 of the scanning line G4 is disabled, and the first data line D1 cannot charge the fourth pixel 14 through the third pixel 13. The third pixel 13 that is turned on through the scanning line G4 is turned off after the first gate pulse P1 of the scanning line G4 is disabled, and therefore, the voltages of the third pixel 13 and the fourth pixel 14 are fixed.

By means of the foregoing description of the driving method of the display panel 300 according to the second embodiment, it can be known how to use the first data line D1 to charge the second pixel 12, the third pixel 13, the pixel 36, and the pixel 37, and it can be known that after the second gate pulse P2 of the scanning line G6 is disabled, the first gate pulse P1 (not shown in the figures) of the scanning line G7 and the second gate pulse P2 of the scanning line G5 are synchronously enabled. Therefore, the first data line D1 further charges four pixels of the next row by means of the foregoing manner.

Figure 5:
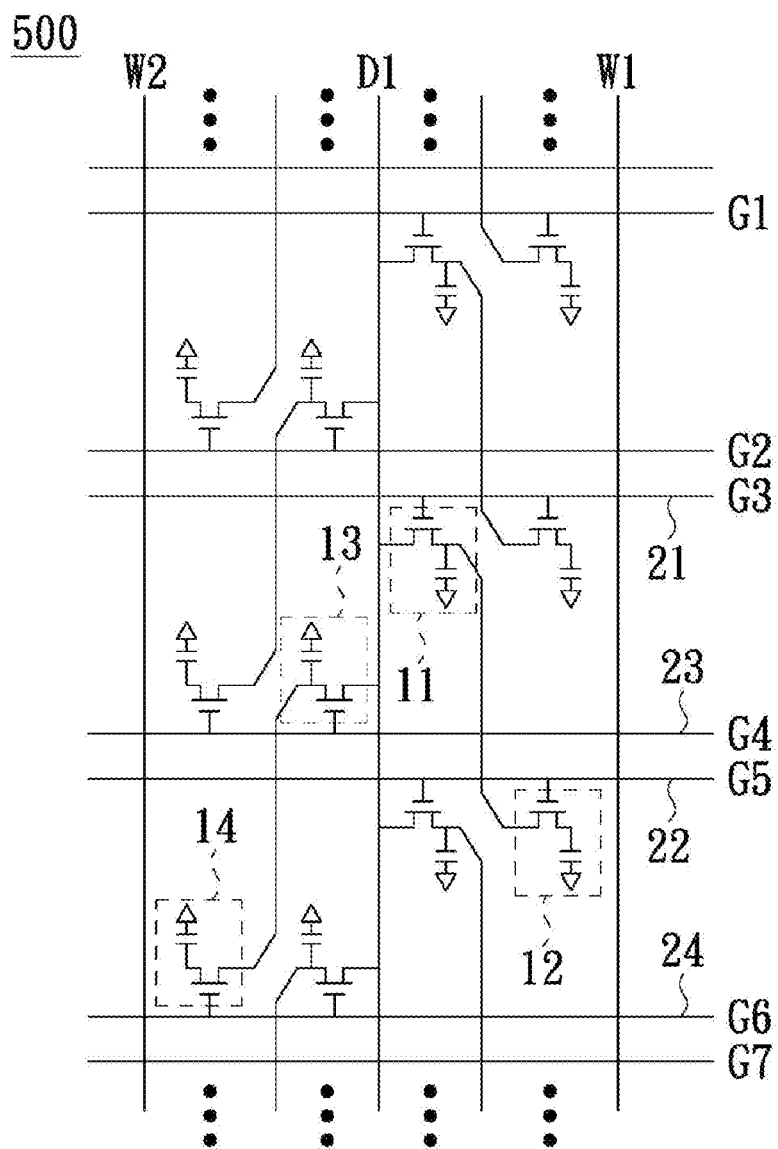
FIG. 5 is a circuit diagram of a display panel according to a third embodiment of the present invention.
Figure 6:
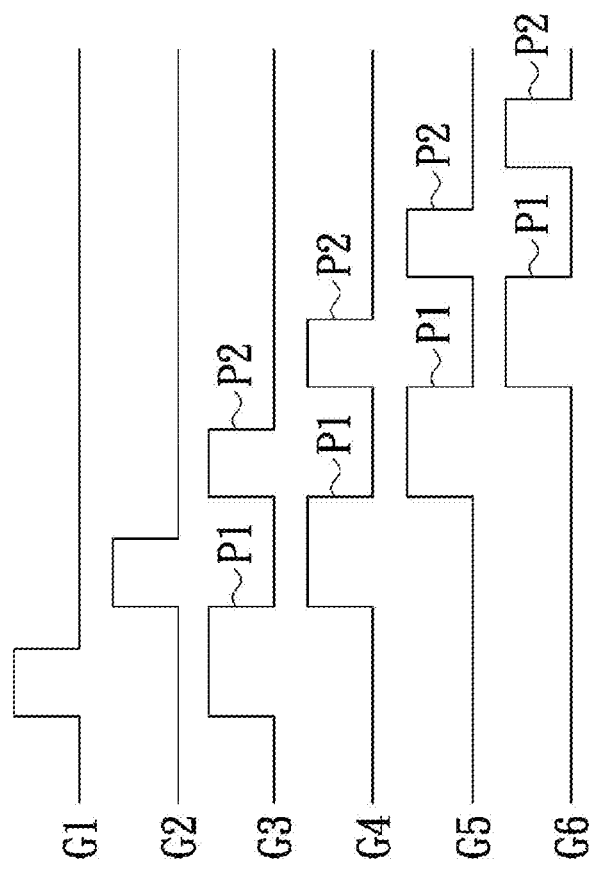
FIG. 6 shows a signal timing diagram of the display panel according to FIG. 5.

FIG. 5 shows a display panel 500 according to a third embodiment, the display panel 500 differs from the display panel 100 and the display panel 300 in that, the scanning line G3 is used as the first scanning line 21, the scanning line G5 is used as the second scanning line 22, the scanning line G4 is used as the third scanning line 23, and the scanning line G6 is used as the fourth scanning line 24. FIG. 6 shows a signal timing diagram of the display panel 500 according to FIG. 5. In the third embodiment, enable periods of first gate pulses P1 are greater than enable periods of second gate pulses P2, each of the first gate pulses P1 is earlier than the corresponding second gate pulse P2, the second gate pulse P2 of the first scanning line 21 and the first gate pulse P1 of the second scanning line 22 are synchronously switched to enable levels, and the second gate pulse P2 of the third scanning line 23 and the first gate pulse P1 of the fourth scanning line 24 are synchronously switched to enable levels.

Subsequently, referring to FIG. 5 and FIG. 6 together, in a period that the second gate pulse P2 of the scanning line G3 and the first gate pulse P1 of the scanning line G5 are synchronously switched to enable levels, the first pixel 11 and the second pixel 12 are turned on, the first data line D1 transmits data to the first pixel 11, and transmits the data to the second pixel 12 through the first pixel 11, so as to charge the second pixel 12. Subsequently, the second gate pulse P2 of the scanning line G3 is disabled, the first data line D1 cannot charge the second pixel 12 through the first pixel 11. In addition, the first pixel 11 is turned off after the second gate pulse P2 of the scanning line G3 is disabled, and therefore, the voltages of the first pixel 11 and the second pixel 12 do not change.

After the first gate pulse P1 of the scanning line G5 is disabled, in a period that the second gate pulse P2 of the scanning line G4 and the first gate pulse P1 of the scanning line G6 are synchronously switched to the enable levels, the third pixel 13 and the fourth pixel 14 are turned on, the first data line D1 transmits data to the third pixel 13, and transmits the data to the fourth pixel 14 through the third pixel 13, so as to charge the fourth pixel 14. Subsequently, the second gate pulse P2 of the scanning line G4 is disabled, the first data line D1 cannot charge the fourth pixel 14 through the third pixel 13. In addition, the third pixel 13 is turned off after the second gate pulse P2 of the scanning line G4 is disabled, and therefore, the voltages of the third pixel 13 and the fourth pixel 14 do not change.

By means of the description of the driving method of the display panel 500 according to the third embodiment that is made by using the scanning lines G3-G6, it can be known how to use the first data line D1 to charge the first pixel 11, the second pixel 12, the third pixel 13, and the fourth pixel 14. Therefore, it can be known that after the first gate pulse P1 of the scanning line G6 is disabled, the first gate pulse P1

(not shown in the figures) of the scanning line G7 and the second gate pulse P2 of the scanning line G5 are synchronously enabled, and the first data line D1 can charge another four pixels through four scanning lines by means of the foregoing manner.

Figure 7:
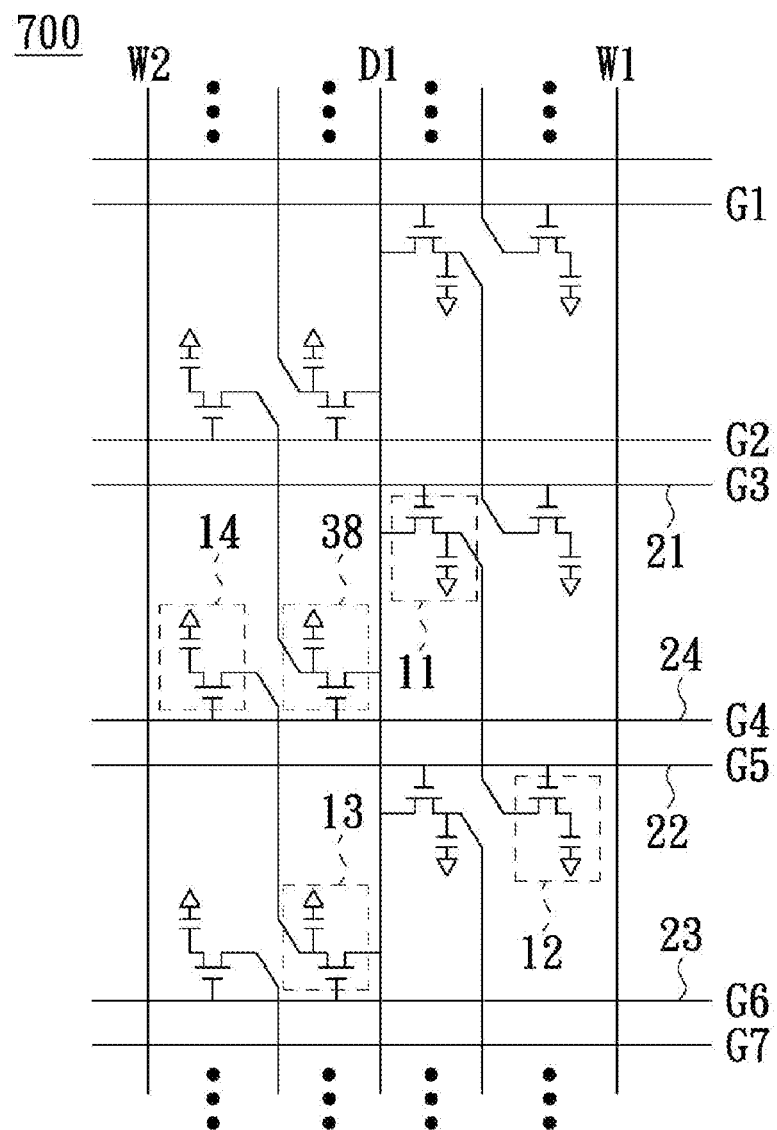
FIG. 7 is a circuit diagram of a display panel according to a fourth embodiment of the present invention.
Figure 8:
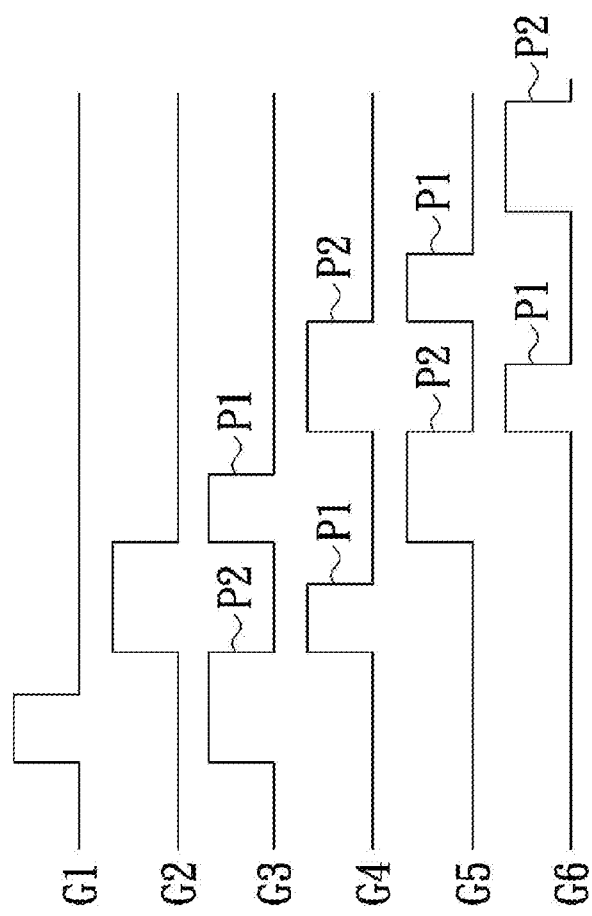
FIG. 8 shows a signal timing diagram of the display panel according to FIG. 7.

FIG. 7 shows a display panel 700 according to a fourth embodiment, the display panel 700 differs from the display panel 100, the display panel 300, and the display panel 500 in that, the scanning line G3 is used as the first scanning line 21, the scanning line G5 is used as the second scanning line 22, the scanning line G6 is used as the third scanning line 23, and the scanning line G4 is used as the fourth scanning line 24. FIG. 8 shows a signal timing diagram of the display panel 700 according to FIG. 7. In the fourth embodiment, enable periods of first gate pulses P1 are less than enable periods of second gate pulses P2, each of the second gate pulses P2 of the first scanning line 21 and the second scanning line 22 is earlier than the corresponding first gate pulse P1, each of the first gate pulses P1 of the third scanning line 23 and the fourth scanning line 24 is earlier than the corresponding second gate pulse P2, the first gate pulse P1 of the first scanning line 21 and the second gate pulse P2 of the second scanning line 22 are synchronously switched to enable levels, and the first gate pulse P1 of the third scanning line 23 and the second gate pulse P2 of the fourth scanning line 24 are synchronously switched to enable levels.

In a period that the first gate pulse P1 of the scanning line G3 and the second gate pulse P2 of the scanning line G5 are synchronously switched to enable levels, the first pixel 11 and the second pixel 12 are turned on, the first data line D1 transmits data to the first pixel 11, and transmits the data to the second pixel 12 through the first pixel 11, so as to charge the second pixel 12. Subsequently, the first gate pulse P1 of the scanning line G3 is disabled, the first data line D1 cannot charge the second pixel 12 through the first pixel 11. In addition, the first pixel 11 is turned off after the first gate pulse P1 of the scanning line G3 is disabled, and therefore, the voltages of the first pixel 11 and the second pixel 12 do not change.

After the second gate pulse P2 of the scanning line G5 is disabled, the second gate pulse P2 of the scanning line G4 and the first gate pulse P1 of the scanning line G6 are synchronously enabled, in a period that the second gate pulse P2 of the scanning line G4 and the first gate pulse P1 of the scanning line G6 are of the enable voltages, the third pixel 13 and the fourth pixel 14 are turned on, the first data line D1 transmits data to the third pixel 13, and transmits the data to the fourth pixel 14 through the third pixel 13, so as to charge the fourth pixel 14. Subsequently, the first gate pulse P1 of the scanning line G6 is disabled, the first data line D1 cannot charge the fourth pixel 14 through the third pixel 13, and therefore, a voltage of the fourth pixel 14 is fixed. At this time, the second gate pulse P2 of the scanning line G4 is still enabled, so as to keep charging the pixel 38 until the second gate pulse P2 of the scanning line G4 is disabled. The fourth pixel 14 and the pixel 38 that are turned on through the scanning line G4 are turned off after the second gate pulse P2 of the scanning line G4 is disabled, and therefore, the voltages of the fourth pixel 14 and the pixel 38 do not change.

By means of the description of the driving method of the display panel 700 according to the fourth embodiment that is made by using the scanning lines G3-G6, it can be known how to use the first data line D1 to charge the first pixel 11, the second pixel 12, the fourth pixel 14, and the pixel 38. Therefore, it can be known that after the second gate pulse P2 of the scanning line G4 is disabled, the second gate pulse P2 (not shown in the figures) of the scanning line G7 and the first gate pulse P1 of the scanning line G5 are synchronously enabled, and the first data line D1 can charge another four pixels through four scanning lines by means of the foregoing manner.

The display panel in the present invention uses a pixel array structure with QSD architecture, so as to charge four pixels by means of one data line. With this architecture, the number of source lines is reduced to a quarter of the number of source lines of original architecture, thereby saving production costs. In addition, a gate driving circuit and a source driving circuit are located on a same side, or a gate driving circuit and a source driving circuit are located on opposite sides of a pixel array, which facilitates application of a narrow bezel technology to a display panel. Further, the display panel in the present invention uses a pixel array structure with QSD architecture, four pixels are located between every two conductive lines, and only one data line is located between two adjacent conductive lines. In this way, wiring of conductive lines and data lines causes no overlapping and interleaving, that is, there is no need to wire the conductive lines and the data lines in different circuit layers, which saves more production costs. Besides, a decrease in wires also achieves a superior aperture ratio.

Although the present invention is described above by means of the preferred embodiments, the above description is not intended to limit the present invention. A person skilled in the art can make variations and modifications without departing from the spirit and scope of the present invention, and therefore, the protection scope of the present invention is as defined in the appended claims.

What is claimed is:

1. A display panel, comprising:
   a plurality of scanning lines located along a first direction, wherein the plurality of scanning lines include a first scanning line, a second scanning line, a third scanning line, and a fourth scanning line;
   a plurality of conductive lines, located along a second direction, each of the conductive lines electrically coupled to one of the scanning lines to transmit at least one gate pulse;
   a plurality of data lines, parallel to the conductive lines;
   a first pixel, located between a first data line and a first conductive line, and coupled to the first data line and the first scanning line;
   a second pixel, located between the first data line and the first conductive line, and coupled to the first pixel and the second scanning line;
   a third pixel, located between the first data line and a second conductive line, and coupled to the first data line and the third scanning line, wherein the first conductive line and the second conductive line are adjacent to the first data line and separated by the first data line; and
   a fourth pixel, located between the first data line and the second conductive line, and coupled to the third pixel and the fourth scanning line.

2. The display panel according to claim 1, wherein each of the first scanning line, the second scanning line, the third scanning line, and the fourth scanning line receives a first gate pulse and a second gate pulse through a conductive line; when one of the first gate pulses and the second gate pulses of the first scanning line and the second scanning line are at an enable level, the first gate pulses and the second gate pulses of the third scanning line and the fourth scanning line are disabled, and when one of the first gate pulses and the second pulses of the third scanning line and the fourth scanning line is at the enable level, the first gate pulses and the second gate pulses of the first scanning line and the second scanning line are disabled.

3. The display panel according to claim 2, wherein the first gate pulses have less enable periods than the second gate pulses, each of the first gate pulses is earlier than a corresponding second gate pulse, the first gate pulse of the first scanning line and the second gate pulse of the second scanning line are synchronously switched to enable levels, and the first gate pulse of the third scanning line and the second gate pulse of the fourth scanning line are synchronously switched to enable levels.

4. The display panel according to claim 2, wherein the first gate pulses have less enable periods than the second gate pulses, each of the first gate pulses of the first scanning line and the second scanning line is earlier than a corresponding second gate pulse, each of the second gate pulses of the third scanning line and the fourth scanning line is earlier than a corresponding first gate pulse, the first gate pulse of the first scanning line and the second gate pulse of the second scanning line are synchronously switched to enable levels, and the first gate pulse of the third scanning line and the second gate pulse of the fourth scanning line are synchronously switched to enable levels.

5. The display panel according to claim 2, wherein the first gate pulses have more enable periods than the second gate pulses, each of the first gate pulses is earlier than a corresponding second gate pulse, the second gate pulse of the first scanning line and the first gate pulse of the second scanning line are synchronously switched to enable levels, and the second gate pulse of the third scanning line and the first gate pulse of the fourth scanning line are synchronously switched to enable levels.

6. The display panel according to claim 2, wherein the first gate pulses have less enable periods than the second gate pulses, each of the second gate pulses of the first scanning line and the second scanning line is earlier than a corresponding first gate pulse, each of the first gate pulses of the third scanning line and the fourth scanning line is earlier than a corresponding second gate pulse, the first gate pulse of the first scanning line and the second gate pulse of the second scanning line are synchronously switched to enable levels, and the first gate pulse of the third scanning line and the second gate pulse of the fourth scanning line are synchronously switched to enable levels.

7. The display panel according to claim 1, wherein the first pixel and the second pixel are located at different pixel rows, and the third pixel and the fourth pixel are located at different pixel rows.

8. A driving method of a display panel, the display panel comprising a plurality of scanning lines, a plurality of conductive lines, a plurality of data lines, a first pixel, a second pixel, a third pixel, and a fourth pixel, wherein the scanning lines are located along a first direction, the conductive lines are located along a second direction, the data lines are substantially parallel to the conductive lines, each of the conductive lines is electrically coupled to one of the scanning lines, so as to transmit at least one gate pulse, the first pixel is electrically coupled to a first scanning line, the second pixel is electrically coupled to a second scanning line, the third pixel is electrically coupled to a third scanning line, and the fourth pixel is electrically coupled to a fourth scanning line, and the driving method comprising:
transmitting a data to the first pixel through a first data line, and transmitting the data to the second pixel through the first pixel, wherein the first pixel and the second pixel are arranged between the first data line and a first conductive line; and
transmitting data to the third pixel through the first data line, and transmitting the data to the fourth pixel through the third pixel, wherein the third pixel and the fourth pixel are arranged between the first data line and a second conductive line,
the first conductive line and the second conductive line are adjacent to the first data line and separated by the first data line, and each of the first scanning line, the second scanning line, the third scanning line, and the fourth scanning line receives a first gate pulse and a second gate pulse through a corresponding conductive line.

9. The driving method of a display panel according to claim 8, wherein the first gate pulses have less enable periods than the second gate pulses, the driving method further comprising:
enabling the first gate pulse of the first scanning line, and synchronously enabling the second gate pulse of the second scanning line;
disabling the first gate pulse of the first scanning line;
disabling the second gate pulse of the second scanning line, and synchronously enabling the first gate pulse of the third scanning line and the second gate pulse of the fourth scanning line;
disabling the first gate pulse of the third scanning line; and
disabling the second gate pulse of the fourth scanning line, and synchronously enabling the second gate pulse of the first scanning line.

10. The driving method of a display panel according to claim 8, wherein the first gate pulses have more enable periods than enable periods of the second gate pulses, the driving method further comprising:
enabling the second gate pulse of the first scanning line, and synchronously enabling the first gate pulse of the second scanning line;
disabling the second gate pulse of the first scanning line;
disabling the first gate pulse of the second scanning line, and synchronously enabling the second gate pulse of the third scanning line and the first gate pulse of the fourth scanning line;
disabling the second gate pulse of the third scanning line; and
disabling the first gate pulse of the fourth scanning line, and synchronously enabling the second gate pulse of the second scanning line.

11. The driving method of a display panel according to claim 8, wherein the first gate pulses have less enable periods than the second gate pulses, the driving method further comprising:
enabling the first gate pulse of the first scanning line, and synchronously enabling the second gate pulse of the second scanning line;
disabling the first gate pulse of the first scanning line;
disabling the second gate pulse of the second scanning line, and synchronously enabling the first gate pulse of the third scanning line and the second gate pulse of the fourth scanning line;
disabling the first gate pulse of the third scanning line; and
disabling the second gate pulse of the fourth scanning line, and synchronously enabling the first gate pulse of the second scanning line.

* * * * *